(12) United States Patent
Obata

(10) Patent No.: US 10,861,712 B2
(45) Date of Patent: Dec. 8, 2020

(54) WORKPIECE PROCESSING METHOD

(71) Applicant: DISCO CORPORATION, Tokyo (JP)

(72) Inventor: Tsubasa Obata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 316 days.

(21) Appl. No.: 15/957,369

(22) Filed: Apr. 19, 2018

(65) Prior Publication Data

US 2018/0308711 A1 Oct. 25, 2018

(30) Foreign Application Priority Data

Apr. 21, 2017 (JP) ................................. 2017-084705

(51) Int. Cl.
*H01L 21/683* (2006.01)
*H01L 21/48* (2006.01)
*H01L 23/00* (2006.01)

(52) U.S. Cl.
CPC ...... *H01L 21/4857* (2013.01); *H01L 21/4803* (2013.01); *H01L 21/6836* (2013.01); *H01L 24/93* (2013.01); *H01L 2221/68331* (2013.01); *H01L 2221/68336* (2013.01)

(58) Field of Classification Search
CPC ............. H01L 21/4857; H01L 21/4803; H01L 21/6836; H01L 24/93; H01L 2221/68331; H01L 2221/68336; H01L 21/78
See application file for complete search history.

(56) References Cited

U.S. PATENT DOCUMENTS

2016/0268155 A1* 9/2016 Morikazu ............... H01L 21/78
2017/0250102 A1* 8/2017 Yoshino ............ H01L 21/67092
2018/0286754 A1* 10/2018 Takenouchi ........ H01L 21/2686

FOREIGN PATENT DOCUMENTS

JP          2001196743 A     7/2001

* cited by examiner

*Primary Examiner* — Peter Dungba Vo
*Assistant Examiner* — Phuong Thai
(74) *Attorney, Agent, or Firm* — Greer Burns & Crain Ltd.

(57) ABSTRACT

A processing method for a plate-shaped workpiece that has a transparent substrate, a first resin layer stacked on a front surface of the substrate, and a second resin layer stacked on a back surface of the substrate and in which the first resin layer is segmented into plural regions by plural planned dividing lines that intersect each other, includes sticking an expandable adhesive tape to the second resin layer, irradiating the workpiece with a laser beam with such a wavelength as to be absorbed by the first resin layer and transmitted through the transparent substrate, the laser beam removing the first resin layer along the planned dividing lines by ablation, the laser beam also forming a modified layer whose refractive index or mechanical strength is different from surroundings along the planned dividing lines.

9 Claims, 5 Drawing Sheets

WORKPIECE PROCESSING METHOD

BACKGROUND OF THE INVENTION

Field of the Invention

The present invention relates to a workpiece processing method for processing a plate-shaped workpiece such as an interposer substrate.

Description of the Related Art

An interposer used for mounting a semiconductor chip and various kinds of electronic parts on a motherboard is known. Because the pitch of electrodes of the semiconductor circuit is very small and thus it is impossible to mount the semiconductor chip directly on the motherboard, the interposer is used in order to widen the pitch between the electrodes and ensure electrical conduction between the motherboard and pads. The interposer is manufactured by dividing an interposer substrate having redistribution layers on both the front and back surfaces of the substrate into chips along planned dividing lines (for example, refer to Japanese Patent Laid-open No. 2001-196743).

As the interposer substrate, a glass epoxy substrate, a glass substrate, a ceramic substrate, and so forth are employed, and resin layers having a conductor pattern composed of copper or the like are stacked on both the front and back surfaces of these substrates and redistribution layers are formed. Conventionally, for dividing of the interposer substrate into individual interposer chips, different kinds of processing from each other are carried out on the redistribution layer on the front surface side of the interposer substrate, the substrate, and the redistribution layer on the back surface side to divide the interposer substrate into the individual interposer chips.

For example, the redistribution layer on the front surface is removed by ablation by irradiation with a laser beam. Subsequently, irradiation with a laser beam with such a wavelength as to be transmitted through the substrate is carried out to form a modified layer inside the substrate. Thereafter, the substrate is turned upside down and the redistribution layer on the back surface side is removed by ablation through irradiation of the redistribution layer with a laser beam and then the whole of the interposer substrate is divided into the individual interposer chips.

SUMMARY OF THE INVENTION

However, the conventional laser processing method has the following problem. Two kinds of laser oscillators, i.e., the laser oscillator for removing the redistribution layers by ablation and the laser oscillator for forming the modified layer in the substrate, are necessary. Furthermore, the step of turning the substrate upside down and removing the redistribution layer on the back surface side by ablation after forming the modified layer in the substrate is necessary. Therefore, the step is complicated and the manufacturing cost is high.

Thus, an object of the present invention is to provide a workpiece processing method that can divide a workpiece having resin layers on both the front and back surfaces of a transparent substrate into chips by a simple method.

In accordance with an aspect of the present invention, there is provided a workpiece processing method that is a processing method of a plate-shaped workpiece that has a transparent substrate, a first resin layer stacked on a front surface of the substrate, and a second resin layer stacked on a back surface of the substrate and in which the first resin layer is segmented into a plurality of regions by a plurality of planned dividing lines that intersect each other. The workpiece processing method includes a tape sticking step of sticking an adhesive tape having expandability to the second resin layer of the workpiece, a holding step of holding the workpiece by a chuck table of laser processing apparatus with the intermediary of the adhesive tape, and a resin layer removing step of irradiating the workpiece with a laser beam having such a wavelength as to be absorbed by the first resin layer and be transmitted through the transparent substrate and removing the first resin layer along the planned dividing lines by ablation processing. The workpiece processing method also includes a modified layer forming step of, after carrying out the resin layer removing step, irradiating the workpiece with the laser beam through a region on the front surface side from which the first resin layer has been removed and forming a modified layer whose refractive index or mechanical strength is different from surroundings along the planned dividing lines inside the transparent substrate, and a dividing step of, after carrying out the modified layer forming step, expanding the adhesive tape and breaking the transparent substrate and the second resin layer on the back surface side along the planned dividing lines by utilizing the modified layer as starting points of breaking to divide the workpiece into chips.

Preferably, the first and second resin layers are redistribution layers and the workpiece is an interposer substrate. Preferably, the modified layer includes shield tunnels having fine pores and altered regions of the transparent substrate that shield these fine pores. Preferably, the shield tunnels formed inside the transparent substrate are formed to appear outward in the front surface or the back surface of the substrate.

According to the processing method of the present invention, when the transparent substrate is broken along the planned dividing lines by the expansion of the adhesive tape, the second resin layer on the back surface side is broken together with the substrate. Therefore, ablation processing of the second resin layer on the back surface side does not need to be carried out and the workpiece can be divided into the chips by irradiation of the workpiece with the laser beam only from the front surface side.

Furthermore, by utilizing the difference between the transparent substrate and the resin, the ablation processing to remove the resin layer by the laser beam with such one kind of wavelength as to be absorbed by the resin layer and be transmitted through the transparent substrate and the internal processing to form starting points of breaking inside the transparent substrate can be implemented. This can provide an effect that the need to prepare oscillators of two different wavelengths is eliminated.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
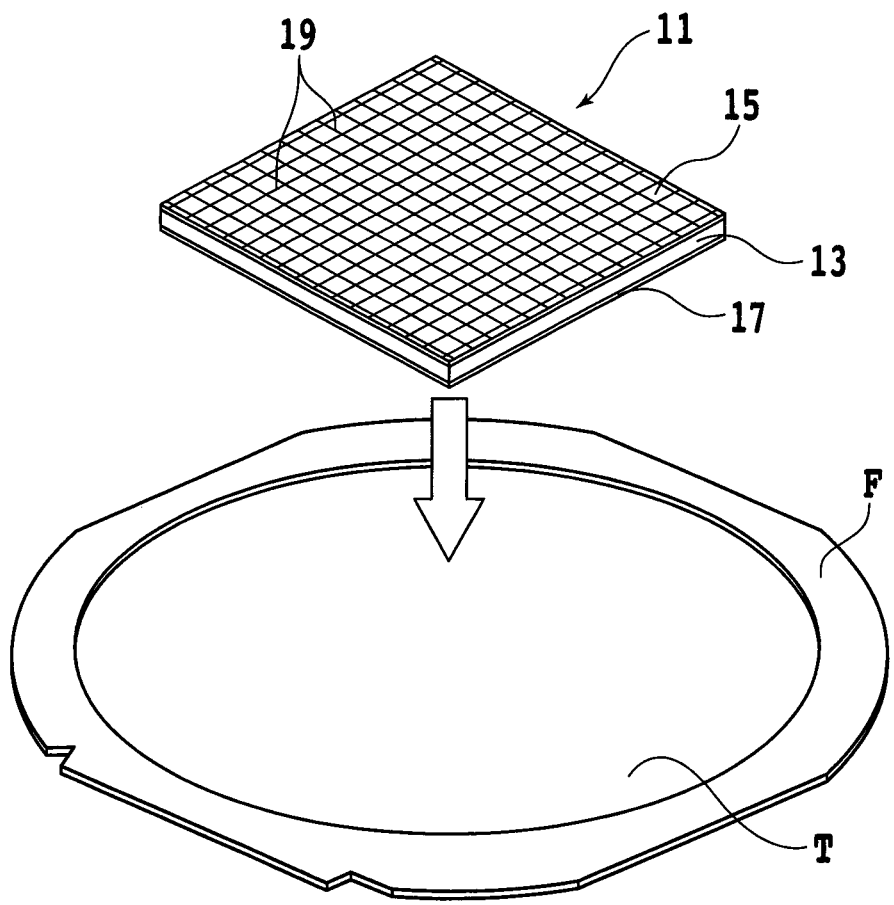
FIG. 1A is a perspective view depicting a tape sticking step.

Embodiments of the present invention will be described below with reference to the drawings. As depicted in FIG. 1A, a plate-shaped workpiece 11 is formed of an interposer substrate in the present embodiment. The interposer substrate 11 is formed through stacking of a first resin layer 15 on the front surface of a transparent substrate 13 and stacking of a second resin layer 17 on the back surface. In the present embodiment, the first resin layer 15 and the second resin layer 17 are both a redistribution layer and are formed through burying of a conductor pattern in a resin. Furthermore, the transparent substrate 13 is formed of a glass substrate in the present embodiment. In the glass substrate 13, plural through-via-holes that connect the conductor pattern of the first resin layer 15 and the conductor pattern of the second resin layer 17 are formed.

Figure 1B:
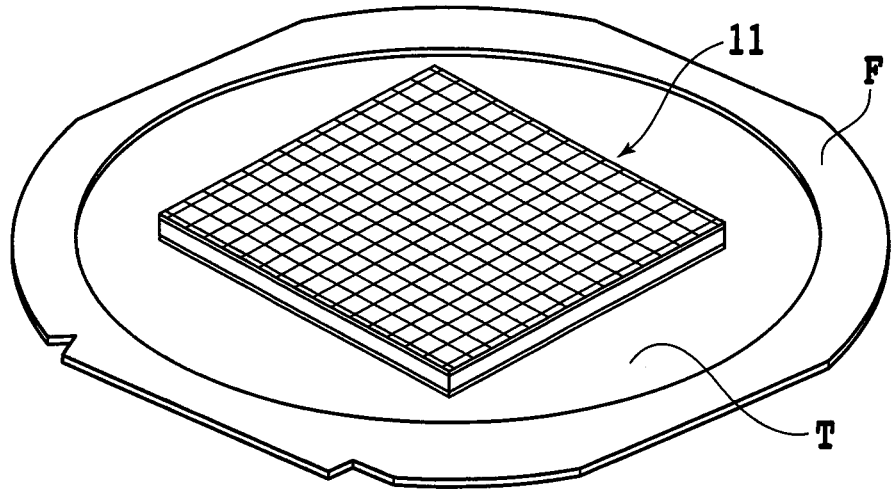
FIG. 1B is a perspective view of the state in which the tape sticking step has been carried out and an interposer substrate is supported by a ring-shaped frame with the intermediary of an adhesive tape.

In a processing method of the present embodiment, first a tape sticking step of sticking the side of the second resin layer 17 of the interposer substrate 11 to an adhesive tape T that has the outer circumferential part mounted on a ring-shaped frame F and has expandability is carried out. When the tape sticking step is carried out, the interposer substrate 11 becomes the state of being supported by the ring-shaped frame F with the intermediary of the adhesive tape T as depicted in FIG. 1B. Although description will be made based on the assumption that the workpiece is the interposer substrate 11 in the present specification, the plate-shaped workpiece is not limited to the interposer substrate and the processing method of the present invention can be applied to a general workpiece having resin layers on both the front and back surfaces of a transparent substrate.

After the tape sticking step is carried out, for removing the first resin layer 15 stacked on the front surface of the transparent substrate 13 along planned dividing lines 19, the interposer substrate 11 is held by suction by a chuck table 10 of laser processing apparatus with the intermediary of the adhesive tape T and the ring-shaped frame F is clamped and fixed by clamps 12 (holding step).

Figure 2A:
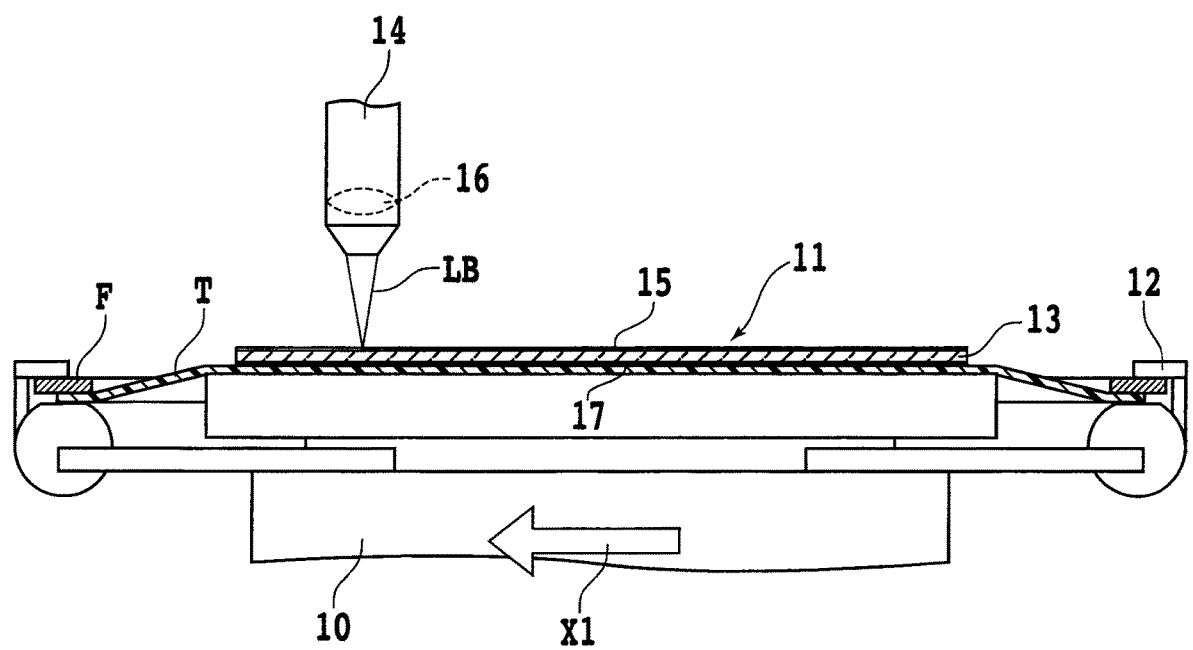
FIG. 2A is a partial sectional side view depicting a resin layer removing step.
Figure 2B:
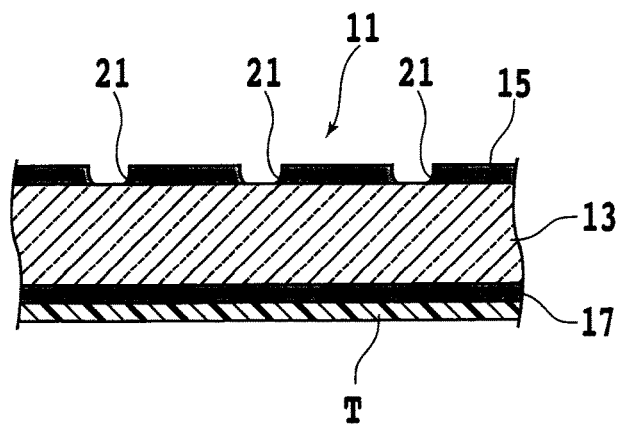
FIG. 2B is an enlarged sectional view of the interposer substrate depicted in FIG. 1A.

After the holding step is carried out, as depicted in FIG. 2A, a resin layer removing step is carried out. Specifically, in the resin layer removing step, irradiation with a laser beam LB with such a wavelength as to be absorbed by the first resin layer 15 and be transmitted through the transparent substrate 13 is carried out in such a manner that the laser beam LB is focused on the first resin layer 15 by a condenser 14 having a condensing lens 16, and processing feed of the chuck table 10 is carried out in a direction of an arrow X1. Thereby, the first resin layer 15 is removed along the planned dividing line 19 and a processed groove 21 like ones depicted in FIG. 2B is formed.

This resin layer removing step is carried out in succession along the planned dividing lines 19 that extend in a first direction with indexing feed in the direction orthogonal to the X1-direction, which is the processing feed direction, by every pitch of the planned dividing line 19. Subsequently, the chuck table 10 is rotated by 90° and thereafter the same resin layer removing step is carried out along all planned dividing lines 19 that extend in a second direction orthogonal to the first direction.

The laser processing condition of the resin layer removing step is set as follows, for example.

Light source: LD excited Q switch Nd:YAG pulse laser
Wavelength: 355 nm (third harmonic wave of the YAG laser)
Repetition frequency: 200 kHz
Average output power: 15 W
Processing feed rate: 500 mm/second After the resin layer removing step is carried out, a modified layer forming step of irradiating the glass substrate 13 with the laser beam LB having the same wavelength as that of the laser beam LB used in the resin layer removing step through the region on the front surface side from which the first resin layer 15 has been removed along the planned dividing line 19 and forming a modified layer along the planned dividing line 19 inside the glass substrate 13 is carried out. The modified layer includes a region that has become the state in which the refractive index, the mechanical strength, or another physical property is different from that of the surroundings. As the modified layer forming step, a shield tunnel forming step of forming shield tunnels that are a modified layer suitable as a starting point of breaking is carried out.

In the laser processing method of the present embodiment, the ablation processing of the first resin layer 15 and the laser processing of the glass substrate 13 are carried out by the laser beam with the same wavelength. Therefore, it is preferable to use a lens whose numerical aperture (NA) is not very high, e.g., the condensing lens 16 whose numerical aperture is approximately 0.1 to 0.3, as the condensing lens 16 of the condenser 14. Moreover, it is preferable for the condensing lens 16 to have a certain level of spherical aberration.

Figure 3A:
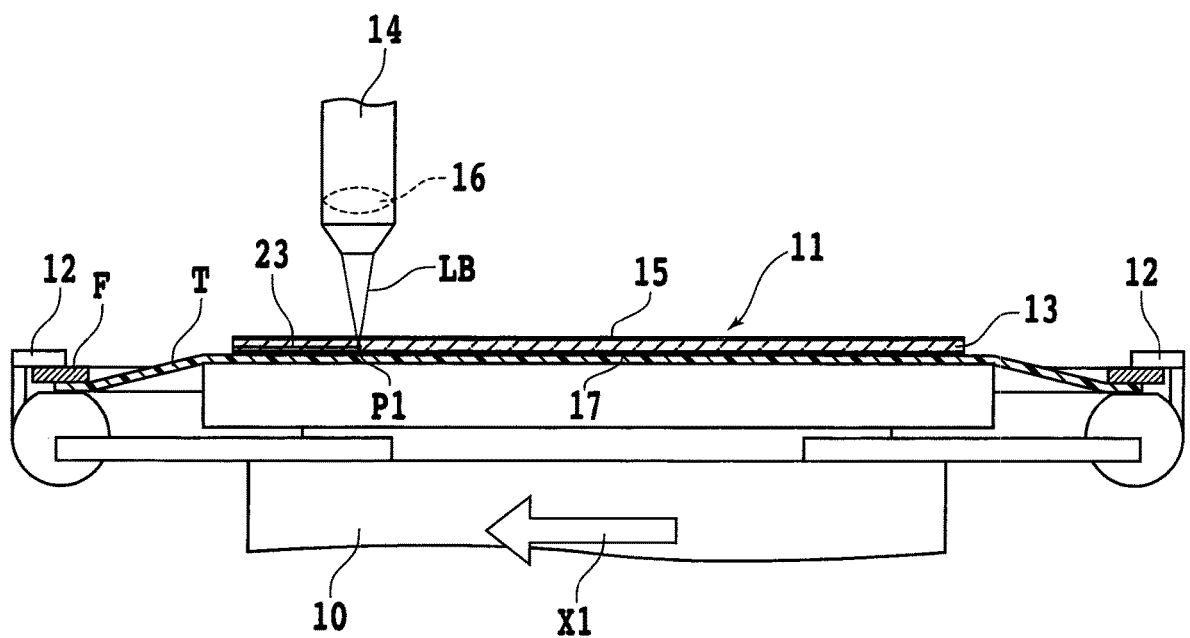
FIG. 3A is a partial sectional side view depicting a shield tunnel forming step.
Figure 3B:
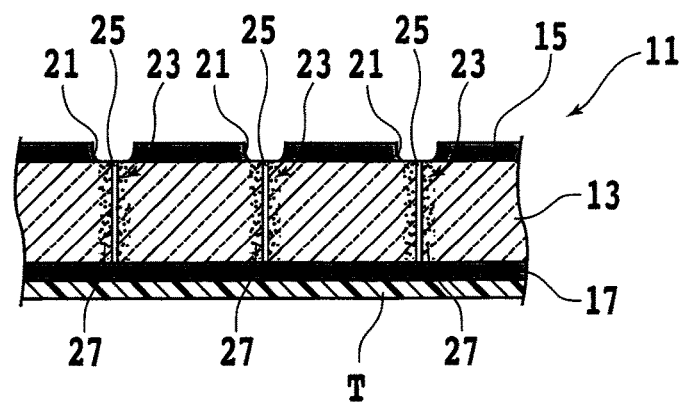
FIG. 3B is an enlarged sectional view of the interposer substrate depicted in FIG. 1A.

In the shield tunnel forming step, as depicted in FIG. 3A, irradiation with the laser beam LB from the condenser 14 is carried out through the processed groove 21 arising from the removal of the first resin layer 15, with a light focus point or condensing point P1 of the laser beam LB positioned near the second resin layer 17 of the glass substrate 13, and processing feed of the chuck table 10 is carried out in the direction of the arrow X1. Thereby, plural shield tunnels 23 composed of plural fine pores 25 and altered regions 27 of glass that shield the respective fine pores 25, like ones depicted in FIG. 3B, are formed inside the glass substrate 13 along the planned dividing lines 19. It is preferable for the fine pores 25 of the shield tunnels 23 to appear outward in the front surface and the back surface of the glass substrate 13. The strength of this shield tunnel 23 is lowered compared with the surroundings and the shield tunnel 23 servers as a starting point of breaking in a later dividing step.

The shield tunnel forming step is carried out along all planned dividing lines 19 that extend in the first direction with indexing feed of the chuck table 10 in the direction orthogonal to the processing feed direction X1 by every pitch of the planned dividing line 19. Subsequently, the chuck table 10 is rotated by 90° and thereafter the same shield tunnel forming step is carried out along all planned dividing lines 19 that extend in the second direction orthogonal to the first direction.

The laser processing condition of the shield tunnel forming step is as follows, for example.

Figure 4A:
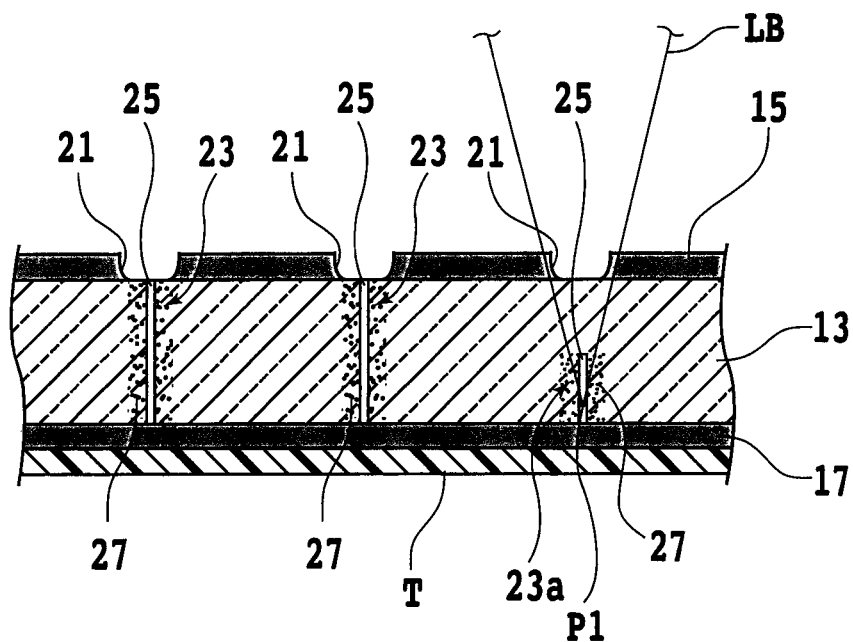
FIG. 4A is a sectional view for explaining the state in which the light focus point of a laser beam is positioned near a second resin layer.

Light source: LD excited Q switch Nd:YAG pulse laser
Wavelength: 355 nm (third harmonic wave of the YAG laser)
Repetition frequency: 200 kHz
Average output power: 15 W
Processing feed rate: 500 mm/second Next, a shield tunnel forming step of a second embodiment of the present invention will be described with reference to FIG. 4A and FIG. 4B. In this shield tunnel forming step of the second embodiment, the irradiation with the laser beam is carried out twice in a divided manner. First, as depicted in FIG. 4A, the light focus point P1 of the laser beam LB is located near the second resin layer 17 in the glass substrate 13 and irradiation with the laser beam LB is carried out through the processed groove 21 formed in the first resin layer 15 to form, inside the glass substrate 13, a shield tunnel 23a composed of the fine pore 25 that extends from the back surface of the glass substrate 13 to a halfway point and the altered region 27 of glass that shields the fine pore 25.

Figure 4B:
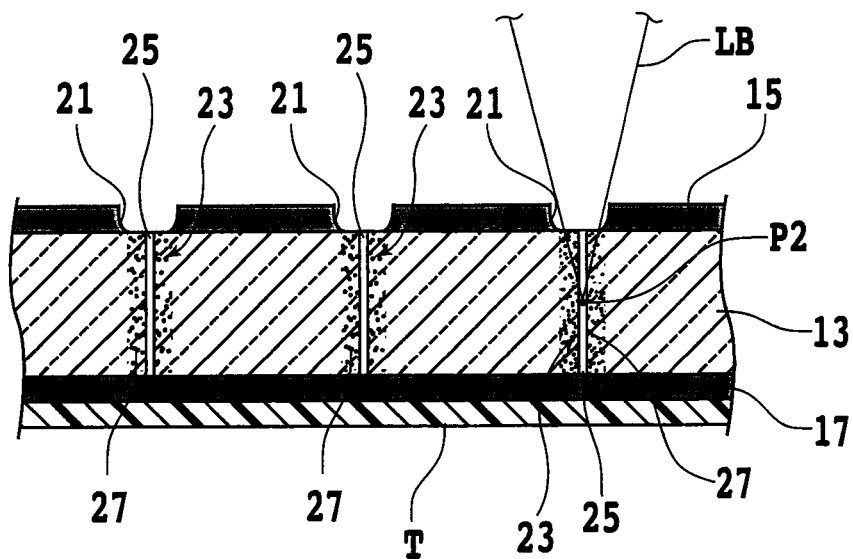
FIG. 4B is a sectional view for explaining the state in which the light focus point of a laser beam is positioned at substantially the central part of the substrate in the thickness direction.

In the first step of the shield tunnel forming step, the power of the laser beam LB is suppressed and thus the shield tunnel 23a does not reach the front surface of the glass substrate 13 but extends to the halfway point. Subsequently, a second step of the shield tunnel forming step like that depicted in FIG. 4B is carried out. In the second step, a light focus point P2 of the laser beam LB is located at the midpoint of the glass substrate 13 in the thickness direction and irradiation with the laser beam LB is carried out through the processed groove 21 formed in the first resin layer 15 to form, along the planned dividing line 19, the shield tunnel 23 composed of the fine pore 25 that extends to the front surface of the glass substrate 13 and the altered region 27 of glass that shields the fine pore 25. When this second step is carried out, the fine pore 25 of the shield tunnel 23 appears outward in both the front and back surfaces of the glass substrate 13.

If the shield tunnel forming step is carried out in such a manner as to be divided into two times, the first step and the second step, as in this second embodiment, the power of the laser beam LB can be suppressed and thus the shield tunnel 23 with higher quality can be formed. The laser processing condition of the shield tunnel forming step of the second embodiment is set as follows, for example.

Light source: LD excited Q switch Nd:YAG pulse laser
Wavelength: 355 nm (third harmonic wave of the YAG laser)
Repetition frequency: 200 kHz
Average output power: first step 10 W, second step 7 W
Processing feed rate: 500 mm/second After the shield tunnel forming step is carried out, the dividing step is carried out. Specifically, in the dividing step, the adhesive tape T to which the interposer substrate 11 is stuck is expanded and the glass substrate 13 and the second resin layer 17 are broken along the planned dividing lines 19 by utilizing the plural shield tunnels 23 formed inside the glass substrate 13 as the starting points of breaking to divide the interposer substrate 11 into the individual interposer chips.

Figure 5A:
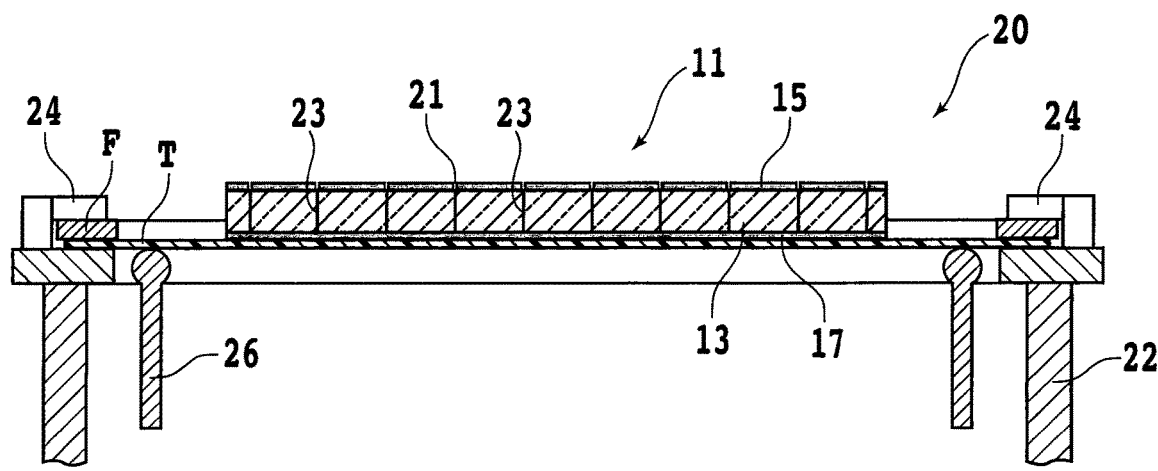
FIG. 5A and FIG. 5B are sectional views depicting a dividing step.
Figure 5B:
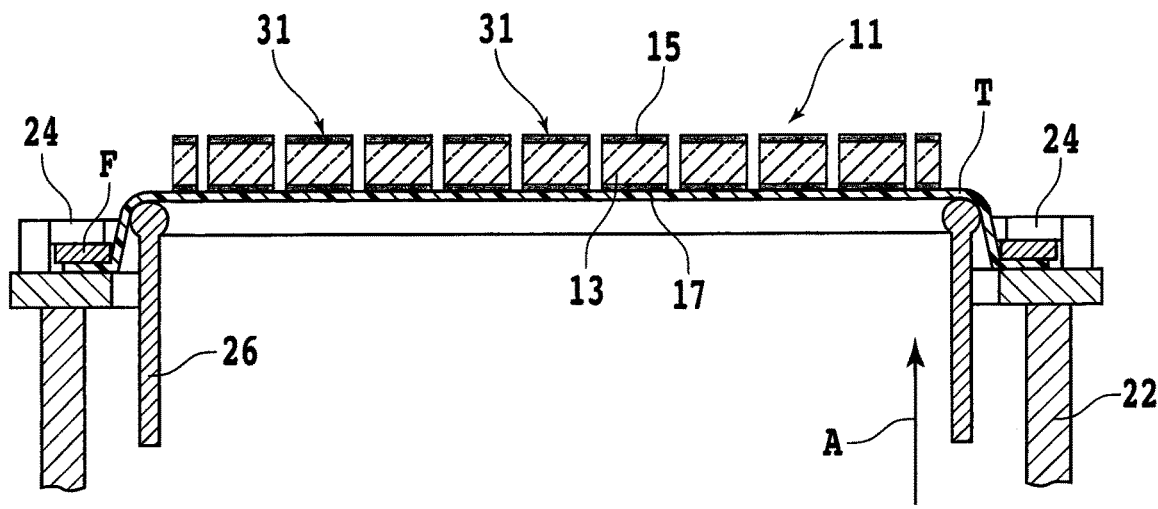

This dividing step is carried out by using expanding apparatus 20 like that depicted in FIG. 5A and FIG. 5B, for example. The expanding apparatus 20 is composed of an outer cylinder 22 and a circular-cylindrical-shaped pressing member 26 that is housed in the outer cylinder 22 and has a diameter that is smaller than the opening of the ring-shaped frame F and is larger than the diameter of the interposer substrate 11. Plural (for example, four) clamps 24 are disposed at equal intervals over the outer cylinder 22. The circular-cylindrical-shaped pressing member 26 is moved in the upward-downward direction between a reference position depicted in FIG. 5A and a raising position depicted in FIG. 5B by drive means, which is not diagrammatically represented.

In the dividing step, first, as depicted in FIG. 5A, in the state in which the circular-cylindrical-shaped pressing member 26 is positioned at the reference position, the interposer substrate 11 is placed over the circular-cylindrical-shaped pressing member 26 with the intermediary of the adhesive tape T and the ring-shaped frame F is clamped and fixed by the clamps 24 of the outer cylinder 22.

Subsequently, as depicted in FIG. 5B, the circular-cylindrical-shaped pressing member 26 is raised in a direction of an arrow A. Due to the raising of the circular-cylindrical-shaped pressing member 26, the adhesive tape T having expandability is expanded mainly in the radial direction and the glass substrate 13 of the interposer substrate 11 stuck to the adhesive tape T is broken into the individual chips, with the plural shield tunnels 23 serving as the starting points of breaking. Furthermore, the second resin layer 17 stacked on the glass substrate 13 is also simultaneously broken, so that the interposer substrate 11 is divided into individual interposer chips 31.

In the above-described embodiment, the first resin layer 15 on the front surface side of the glass substrate 13 is removed by ablation with a laser beam along the planned dividing lines 19 and the plural shield tunnels 23 that serve as starting points of dividing are formed in the glass substrate 13 by a laser beam having the same wavelength as the ablation processing. Thereafter, by expanding the adhesive tape T by the expanding apparatus 20 to give an external force to the interposer substrate 11, the second resin layer 17 on the back surface side is divided together with the glass substrate 13 into the individual interposer chips 31. Therefore, ablation processing of the second resin layer 17 on the back surface side does not need to be carried out and the interposer substrate 11 can be divided into the individual chips 31 by irradiation with the laser beam LB only from the front surface side.

By utilizing the property of absorption of the first resin layer 15 and transmission of the glass substrate 13 with respect to the wavelength of the laser beam, the ablation processing to remove the first resin layer 15 and the internal processing to form starting points of breaking in the glass substrate 13 can be implemented by the laser beam with one kind of wavelength of 355 nm or the like. Therefore, two laser oscillators that oscillate lasers with different wavelengths do not need to be prepared.

In the above-described embodiment, a laser beam with a wavelength of 355 nm is employed as the laser beam with such a wavelength as to be transmitted through a transparent substrate. However, a pulse laser beam with a wavelength of 532 nm that is the second harmonic wave of a YAG pulse laser may be used as the laser beam.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A workpiece processing method that is a processing method of a plate-shaped workpiece having a transparent substrate, a first resin layer stacked on a front surface of the transparent substrate, and a second resin layer stacked on a back surface of the transparent substrate, the first resin layer being segmented into a plurality of regions by a plurality of planned dividing lines that intersect each other, the workpiece processing method comprising:

sticking an adhesive tape having expandability onto the second resin layer stacked on a back surface of the transparent substrate of the workpiece;

holding the workpiece by supporting the adhesive tape on a frame positioned on a chuck table of a laser processing apparatus;

irradiating the workpiece along the planned dividing lines with a laser beam having such a wavelength as to be absorbed by the first resin layer and be transmitted through the transparent substrate; thereby removing the first resin layer along the planned dividing lines by ablation processing;

forming a modified layer, after removing the first resin layer, by irradiating the transparent substrate and the second resin layer with the laser beam through a region on a front surface side from which the first resin layer has been removed; thereby forming a modified layer in the substrate whose refractive index or mechanical strength is different from surroundings along the planned dividing lines inside the transparent substrate; and dividing said workpiece, after carrying out the modified layer forming step, bar expanding the adhesive tape and breaking the transparent substrate and the second resin layer on the back surface along the planned dividing lines by utilizing the modified layer as starting points of breaking; thereby dividing the workpiece into chips.

2. The workpiece processing method according to claim 1, wherein the modified layer includes a plurality of shield tunnels having a plurality of fine pores and altered regions of the transparent substrate that shield the plurality of fine pores.

3. The workpiece processing method according to claim 1, wherein the first resin layer and the second resin layer are redistribution layers and the workpiece is an interposer substrate.

4. The workpiece processing method according to claim 2, wherein the plurality of shield tunnels appear outward in the front surface of the transparent substrate.

5. The workpiece processing method according to claim 3, wherein at least one of the first resin layer and the second resin layer includes a conductor pattern in a resin.

6. A workpiece processing method that is a processing method of a plate-shaped workpiece having a transparent substrate, the workpiece processing method comprising:

forming a first resin layer on a front surface of the transparent substrate, wherein the first resin layer being is segmented into a plurality of regions by a plurality of planned dividing lines that intersect each other;

forming a second resin layer on a back surface of the transparent substrate, wherein said first resin layer and said second resin layer each include a conductor in a resin, sticking an adhesive tape having expandability onto the second resin layer stacked on a back surface of the transparent substrate of the workpiece;

holding the workpiece by supporting the adhesive tape on a frame on a chuck table of a laser processing apparatus;

irradiating the workpiece along the planned dividing lines with a laser beam having such a wavelength as to be absorbed by the first resin layer and be transmitted through the transparent substrate; thereby removing the first resin layer along the planned dividing lines by ablation processing;

forming a modified layer, after removing the first resin layer, by irradiating the transparent substrate and the second resin layer with the laser beam through a region on a front surface side from which the first resin layer has been removed; thereby forming a modified layer in the substrate whose refractive index or mechanical strength is different from surroundings along the planned dividing lines inside the transparent substrate; and dividing said workpiece, after carrying out the modified layer forming step, bar expanding the adhesive tape and breaking the transparent substrate and the second resin layer on the back surface along the planned dividing lines by utilizing the modified layer as starting points of breaking; thereby dividing the workpiece into chips.

7. The workpiece processing method according to claim 6, wherein the modified layer includes a plurality of shield tunnels having a plurality of fine pores and altered regions of the transparent substrate that shield the plurality of fine pores.

8. The workpiece processing method according to claim 7, wherein the plurality of shield tunnels appear outward in the front surface of the transparent substrate.

9. The workpiece processing method according to claim 6, wherein the first resin layer and the second resin layer are redistribution layers and the workpiece is an interposer substrate.

* * * * *